(12) United States Patent
Chen et al.

(10) Patent No.: US 8,669,585 B1
(45) Date of Patent: Mar. 11, 2014

(54) LED THAT HAS BOUNDING SILICON-DOPED REGIONS ON EITHER SIDE OF A STRAIN RELEASE LAYER

(75) Inventors: Zhen Chen, Pleasanton, CA (US); Yi Fu, Hacienda Heights, CA (US)

(73) Assignee: Toshiba Techno Center Inc., Tokyo (JP)

( * ) Notice: Subject to any disclaimer, the term of this patent is extended or adjusted under 35 U.S.C. 154(b) by 0 days.

(21) Appl. No.: 13/602,145

(22) Filed: Sep. 1, 2012

Related U.S. Application Data

(60) Provisional application No. 61/530,972, filed on Sep. 3, 2011.

(51) Int. Cl.
*H01L 29/36* (2006.01)

(52) U.S. Cl.
USPC ............... 257/101; 257/102; 257/97; 257/13; 257/17; 257/18; 257/E33.029; 257/E33.043; 438/45

(58) Field of Classification Search
USPC ......... 257/2–15, 17, 18, 22, 96, 97, 101, 102, 257/103, 190, 196, 200, 20, 201, 257/E33.005–E33.043; 438/36, 45, 46, 47
See application file for complete search history.

(56) References Cited

U.S. PATENT DOCUMENTS

| | | | |
|---|---|---|---|
| 5,306,662 A | 4/1994 | Nakamura et al. |
| 5,408,120 A | 4/1995 | Manabe et al. |
| 5,468,678 A | 11/1995 | Nakamura et al. |
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,777,350 A | 7/1998 | Nakamura et al. |
| 5,959,307 A | 9/1999 | Nakamura et al. |
| 5,959,401 A | 9/1999 | Asami et al. |
| 6,005,258 A | 12/1999 | Manabe et al. |
| 6,040,588 A | 3/2000 | Koide et al. |
| RE36,747 E | 6/2000 | Manabe et al. |
| 6,215,133 B1 | 4/2001 | Nakamura et al. |
| 6,265,726 B1 | 7/2001 | Manabe et al. |

(Continued)

OTHER PUBLICATIONS

Wu, L. W. et al. Influence of Si-Doping on the Characteristics of InGaN—GaN Multiple Quantum-Well Blue Light Emitting Diodes. May 2002. IEEE Journal of Quantum Electronics. vol. 38, No. 5. pp. 446-450.*

*Primary Examiner* — Julio J Maldonado
*Assistant Examiner* — Molly Reida
(74) *Attorney, Agent, or Firm* — Hogan Lovells US LLP

(57) ABSTRACT

A strain release layer adjoining the active layer in a blue LED is bounded on the bottom by a first relatively-highly silicon-doped region and is also bounded on the top by a second relatively-highly silicon-doped region. The second relatively-highly silicon-doped region is a sublayer of the active layer of the LED. The first relatively-highly silicon-doped region is a sublayer of the N-type layer of the LED. The first relatively-highly silicon-doped region is also separated from the remainder of the N-type layer by an intervening sublayer that is only lightly doped with silicon. The silicon doping profile promotes current spreading and high output power (lumens/watt). The LED has a low reverse leakage current and a high ESD breakdown voltage. The strain release layer has a concentration of indium that is between $5 \times 10^{19}$ atoms/cm$^3$ and $5 \times 10^{20}$ atoms/cm$^3$, and the first and second relatively-highly silicon-doped regions have silicon concentrations that exceed $1 \times 10^{18}$ atoms/cm$^3$.

28 Claims, 4 Drawing Sheets

(56) References Cited

U.S. PATENT DOCUMENTS

| | | |
|---|---|---|
| 6,326,236 B1 | 12/2001 | Koide et al. |
| 6,420,733 B2 | 7/2002 | Koide et al. |
| 6,541,293 B2 | 4/2003 | Koide et al. |
| 6,610,995 B2 | 8/2003 | Nakamura et al. |
| 6,657,236 B1 | 12/2003 | Thibeault et al. |
| 6,800,500 B2 | 10/2004 | Coman et al. |
| 6,838,693 B2 | 1/2005 | Kozaki |
| 6,849,881 B1 | 2/2005 | Harle et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,026,653 B2 | 4/2006 | Sun |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,193,246 B1 | 3/2007 | Tanizawa et al. |
| 7,262,436 B2 | 8/2007 | Kondoh et al. |
| 7,312,474 B2 | 12/2007 | Emerson et al. |
| 7,335,920 B2 | 2/2008 | Denbaars et al. |
| 7,345,297 B2 | 3/2008 | Yamazoe et al. |
| 7,348,602 B2 | 3/2008 | Tanizawa |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,611,917 B2 | 11/2009 | Emerson et al. |
| 7,709,851 B2 | 5/2010 | Bader et al. |
| 7,737,459 B2 | 6/2010 | Edmond et al. |
| 7,754,514 B2 | 7/2010 | Yajima et al. |
| 7,791,061 B2 | 9/2010 | Edmond et al. |
| 7,791,101 B2 | 9/2010 | Bergmann et al. |
| 7,795,623 B2 | 9/2010 | Emerson et al. |
| 7,910,945 B2 | 3/2011 | Donofrio et al. |
| 7,939,844 B2 | 5/2011 | Hahn et al. |
| 7,947,994 B2 | 5/2011 | Tanizawa et al. |
| 8,021,904 B2 | 9/2011 | Chitnis |
| 8,030,665 B2 | 10/2011 | Nagahama et al. |
| 2002/0110945 A1* | 8/2002 | Kuramata et al. ............ 438/36 |
| 2009/0152585 A1* | 6/2009 | Shinohara et al. ........... 257/103 |
| 2010/0187496 A1* | 7/2010 | Yan ................................ 257/13 |
| 2011/0140083 A1* | 6/2011 | Driscoll et al. ................ 257/15 |
| 2012/0037881 A1* | 2/2012 | Kim et al. ...................... 257/13 |

\* cited by examiner

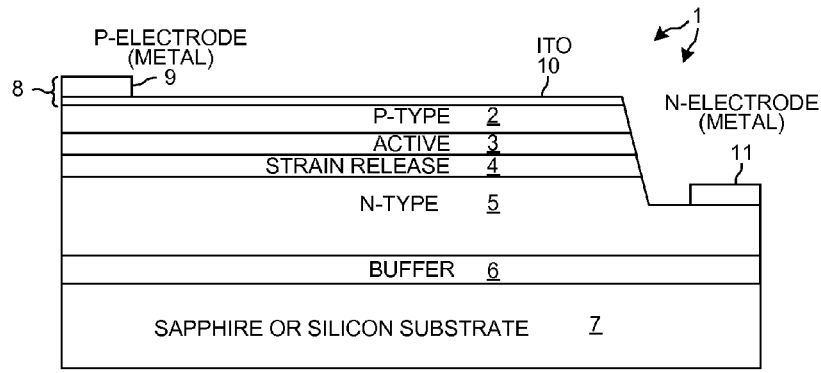

FIG. 1

| P-TYPE LAYER | p-GaN<br>INDIUM = 4E18 ATOMS/CCM<br>MAGNESIUM > 1E19 ATOMS/CCM<br>THERE ARE NO CURRENT FOCUSING RIDGES ON UPPER SURFACE OF THE P-LAYER | 300nm |
|---|---|---|
| ACTIVE LAYER | InGaN/GaN PERIODS<br>10 PERIODS (MQW)<br>InGaN  3nm (QUANTUM WELL), INDIUM=4E20 ATOMS/CCM<br>GaN  10nm (QUANTUM BARRIER), INDIUM=0 ATOMS/CCM<br>EMITS NON-MONOCHROMATIC 440nm-490nm WAVELENGTH LIGHT<br>FOR SILICON DOPANT PROFILE SEE FIG. 3. | 130nm |
| STRAIN RELEASE LAYER | $In_xGa_{1-x}N/In_yGa_{1-y}N$ PERIODS<br>30 PERIODS<br>$In_xGa_{1-x}N$  2.0nm, 0<x<0.12, INDIUM=0-2E20 ATOMS/CCM<br>$In_yGa_{1-y}N$  2.0nm, 0≤y<0.12, INDIUM=0-2E20 ATOMS/CCM | 120nm |
| N-TYPE LAYER | n-GaN/n-AlGaN:Si or AlN PERIODS<br>INDIUM = 0 ATOMS/CCM<br>5 PERIODS<br>n-GaN  <1000 nm (e.g., 900nm)<br>n-AlGaN:Si <25nm (e.g., 5nm)<br>ONE n-GaN SUBLAYER IS AT THE TOP OF THE N-TYPE LAYER, AND ANOTHER IS AT THE BOTTOM OF THE N-TYPE LAYER<br>SILICON IS THE N-TYPE DOPANT, FOR DOPANT PROFILE SEE FIG. 3. | ~5000nm |

FIG. 2

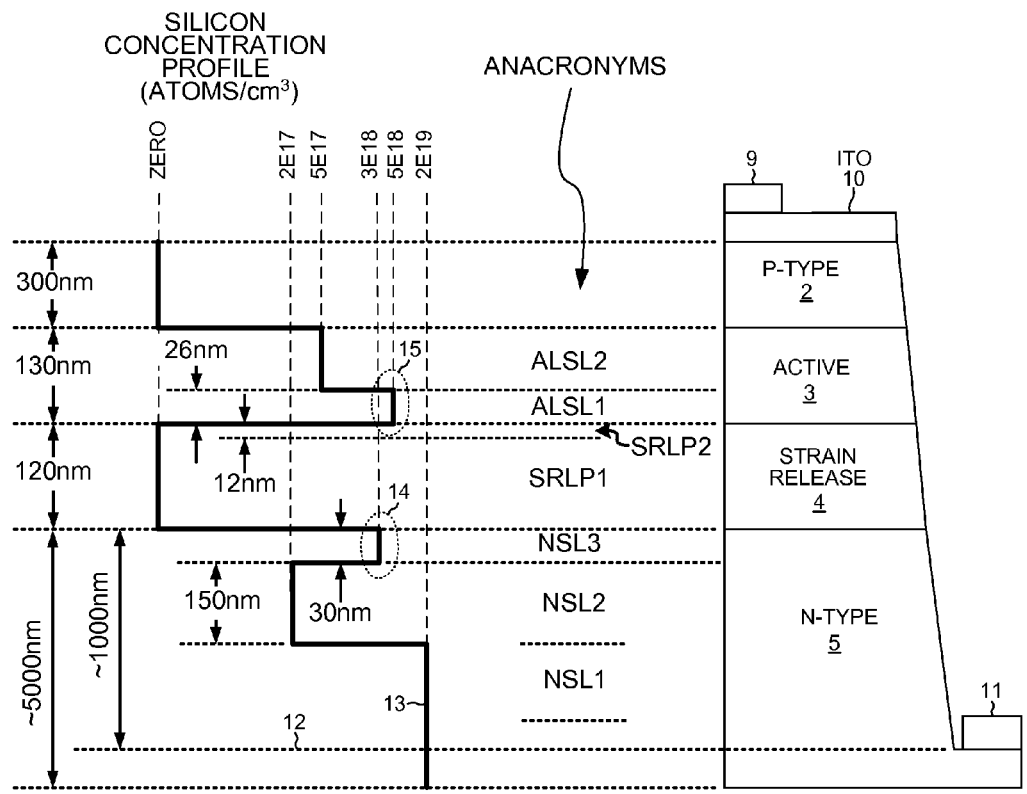

FIG. 3

| EXPERIMENT EXAMPLE | DESCRIPTION OF Si DOPANT PROFILE | REVERSE LEAKAGE CURRENT (MICROAMPS) | OUTPUT POWER (LUMENS/ WATT) | ESD BREAKDOWN VOLTAGE (VOLTS) |
|---|---|---|---|---|
| #1 | SRL UNIFORMLY UNDOPED | 2.0 | 120 | ~4000 |
| #2 | SRL UNIFORMLY LIGHTLY DOPED | 0.5 | 130 | ~1000 |
| #3 | ONE SPIKE AT ACTIVE-TO-SRL INTERFACE | 0.1 | 140 | ~2000 |
| #4 | ONE SPIKE AT SRL-TO-nGAN INTERFACE | 0.1 | 120 | ~500 |
| #5 | TWO SPIKES (LED OF FIGS. 1-3) | 0.1 | 140 | ~4000 |

CONTROLLED EXPERIMENT, ALL FACTORS OTHER THAN THE SILICON DOPING PROFILE ARE THE SAME FOR ALL EXAMPLES

LED THAT HAS BOUNDING SILICON-DOPED REGIONS ON EITHER SIDE OF A STRAIN RELEASE LAYER

CROSS REFERENCE TO RELATED APPLICATION

This application claims priority under 35 U.S.C. §119 from U.S. Provisional Application No. 61/530,972, entitled "An LED That Has Bounding Silicon-Doped Regions on Either Side of a Strain Release Layer," filed on Sep. 3, 2011, the subject matter of which is incorporated herein by reference.

TECHNICAL FIELD

The present invention relates generally to blue LED (Light-Emitting Diode) devices.

BACKGROUND INFORMATION

A light emitting diode (LED) is a solid state device that converts electrical energy into light. Light is emitted from an active layer of semiconductor materials sandwiched between oppositely doped layers when a voltage is applied across the doped layers. One type of commercially available LED device structure is a so-called lateral blue LED. One type of lateral blue LED involves a substrate and an N-type layer disposed over the substrate. There may be a buffer layer and a template layer and other layers disposed between the substrate and the N-type layer. A strain release layer is disposed on the N-type layer. A Multiple Quantum Well (MQW) active layer is disposed on the strain release layer. A P-type layer is disposed on the active layer. In one example, a first electrode comprising a metal portion and a transparent conductor portion makes electrical contact with the top of the P-type layer. A second electrode of metal makes electrical contact with the N-type layer. The P-type layer may be a magnesium doped layer of p-GaN (gallium nitride). The n-type layer may be a silicon doped layer of n-GaN. The active layer typically involves InGaN/GaN periods as is known in the art. The strain release layer may involve periods of $In_xGa_{1-x}N/In_yGa_{1-y}N$, where $x \neq y$. Ways of improving the performance of such blue LED devices are sought.

SUMMARY

A strain release layer adjoins the active layer in a blue LED. The strain release layer is bounded on the bottom by a first relatively-highly silicon-doped region and is also bounded on the top by a second relatively-highly silicon-doped region. The first relatively-highly silicon-doped region is a sublayer of the N-type layer of the LED. The second relatively-highly silicon-doped region is a sublayer of the active layer of the LED. The first relatively-highly silicon-doped region is also separated from the remainder of the N-type layer by an intervening sublayer that is only lightly doped with silicon. The silicon doping profile promotes current spreading. The LED has high output power (for example, 140 lumens/watt), a low reverse leakage current (for example, 0.1 microamperes), and a high ESD breakdown voltage (for example, 4000 volts).

An LED device includes a substrate, a buffer layer, an N-type layer, a strain release layer and a multiple quantum well active layer. The substrate is crystalline silicon. The buffer layer is adjacent to the substrate. The N-type layer is made of gallium nitride (GaN) and is adjacent to the buffer layer. The N-type layer includes a sublayer NSL3 that has a first silicon dopant concentration. The strain release layer has a first portion SRLP1 and a second portion SRLP2. The first portion SRLP1 is adjacent to the sublayer NSL3. The strain release layer has a second silicon dopant concentration. The active layer has a sublayer ALSL1 that is adjacent to the second portion SRLP2. The sublayer ALSL1 has a third silicon dopant concentration. Both the first silicon dopant concentration and the third silicon dopant concentration are higher than the second silicon dopant concentration.

Each of the first silicon dopant concentration and the third silicon dopant concentration exceeds $1 \times 10^{18}$ atoms/cm$^3$, whereas the second silicon dopant concentration is less than $5 \times 10^{16}$ atoms/cm$^3$. The strain release layer has a concentration of indium that is between $5 \times 10^{19}$ atoms/cm$^3$ and $5 \times 10^{20}$ atoms/cm$^3$.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 1 is a cross-sectional side view of blue Light Emitting Diode (LED) device in accordance with one novel aspect.

FIG. 2 is a table that sets forth the thicknesses and constituent materials of the various layers of the LED device of FIG. 1.

FIG. 3 is a diagram that sets forth a silicon doping profile through the various layers of the LED device of FIG. 1.

FIG. 4 is a table that compares testing results of the LED structure of FIGS. 1-3 with testing results of other LED structures that do not have the same silicon doping profile but otherwise are similar to the LED structure of FIGS. 1-3.

DETAILED DESCRIPTION

Figure 5:
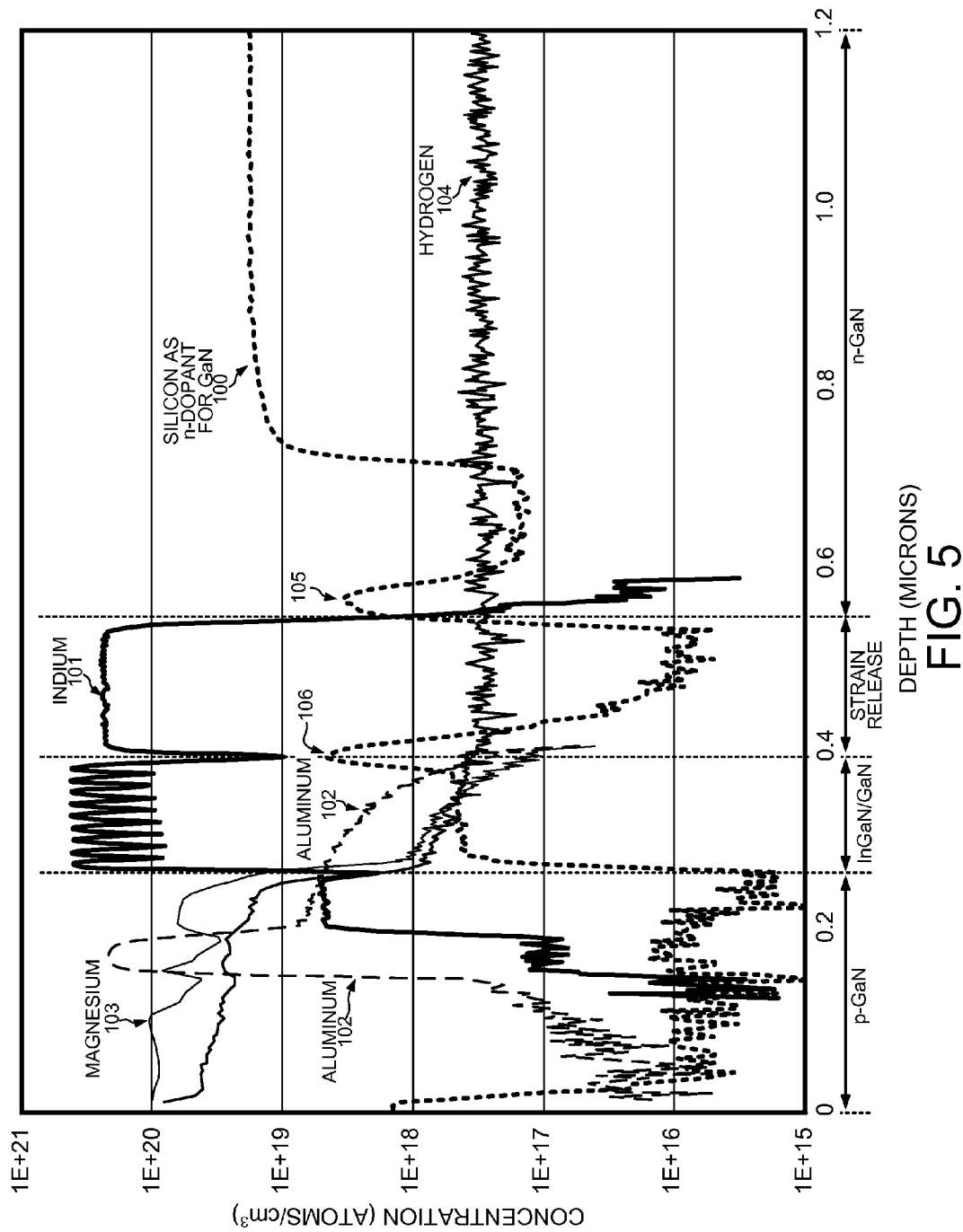
FIG. 5 is a chart of SIMS (Secondary Ion Mass Spectroscopy) concentration profile data for various constituent elements of an LED device.

Reference will now be made in detail to some embodiments of the invention, examples of which are illustrated in the accompanying drawings.

Reference will now be made in detail to some embodiments of the invention, examples of which are illustrated in the accompanying drawings. In the description and claims below, when a first layer is referred to as being disposed "over" a second layer, it is to be understood that the first layer can be directly on the second layer, or an intervening layer or layers may be present between the first and second layers. The terms such as "over", "under", "upper", "lower", "top", "bottom", "upward", "downward", "vertically", and "laterally" are used herein to describe relative orientations between different parts of the blue LED device being described, and it is to be understood that the overall blue LED device being described can actually be oriented in any way in three-dimensional space.

FIG. 1 is a cross-sectional side view of blue light emitting diode (LED) device 1 in accordance with one aspect. LED device 1 includes a P-type layer 2, a Multiple Quantum Well (MQW) active layer 3, a strain release layer 4, and N-type layer 5, a buffer layer 6, and a substrate 7, stacked upon each other as illustrated. Substrate 7 may be sapphire or silicon. There may be additional intervening layers disposed between the buffer layer 6 and the N-type layer 5 such as a template layer of undoped GaN. A first electrode 8, which includes a metal portion 9 and a transparent conductor portion 10, makes electrical contact with the top of the P-layer 2. In one embodiment, the transparent conductor portion 10 is made of indium tin oxide (ITO). A second electrode 11 of metal makes electrical contact with the N-type layer 5.

FIG. 2 is a table that sets forth more detail about the composition and thicknesses of the various layers of the LED device of FIG. 1.

FIG. 3 is a diagram that sets forth a silicon doping profile through the various layers of the LED device 1 of FIG. 1. N-type layer 5 in one embodiment includes about five periods, where each period includes a relatively thick layer of n-GaN (for example, 900 nm thick) and a relatively thin layer of n-AlGaN:Si (for example, 25 nm thick). There is one of these relatively thick n-GaN layers at the bottom of the N-type layer 5, and there is one of these relatively thick n-GaN layers at the top of the N-type layer 5. The relatively thick n-GaN layer at the top of the N-type layer includes a first sublayer NSL1, a second sublayer NSL2 and a third sublayer NSL3 as illustrated in FIG. 3. FIG. 3 shows that the third sublayer NSL3 is about thirty nanometers thick. The bottom of sublayer NSL1 is above the level 12 of a trench upon which n-electrode 11 is disposed. The silicon dopant concentration in NSL1 is higher than $1 \times 10^{19}$ atoms/cm$^3$ (for example, $2 \times 10^{19}$ atoms/cm$^3$). The silicon dopant concentration in NSL2 is lower than $1 \times 10^{18}$ atoms/cm$^3$ (for example, $2 \times 10^{17}$ atoms/cm$^3$). The silicon dopant concentration in NSL3 is higher than $1 \times 10^{18}$ atoms/cm$^3$ (for example, $3 \times 10^{18}$ atoms/cm$^3$).

Strain release layer 4 in one example includes thirty periods, where each period includes a 2 nm thick layer of In$_x$Ga$_{1-x}$N, 0≤x<0.12, and where each period also includes a 2 nm thick layer of In$_y$Ga$_{1-y}$N, 0≤y<0.12, where x≠y. Strain release layer 4 is particularly important where substrate 7 is silicon as opposed to sapphire. The N-type layer 5 of n-GaN exhibits a high level of stress where substrate 7 is silicon because of the lattice mismatch between crystalline silicon and GaN. Strain release layer 4 helps to relieve some of the strain on the GaN and InGaN lattices. Strain release layer 4 is considered to involve a first portion SRLP1 and a second portion SRLP2. SRLP1 and SRLP2 are disposed with respect to one another as illustrated in FIG. 3. Second portion SRLP2 in one example is the thickness of three of the 4.0 nm thick In$_x$Ga$_{1-x}$N/In$_y$Ga$_{1-y}$N periods. In the example of FIG. 3, the silicon concentration in both portions SRLP1 and SRLP2 is below $5 \times 10^{18}$ atoms/cm$^3$ (for example, as close to zero atoms/cm$^3$ as practical).

Active layer 3 in one example includes ten periods, where each period includes a 3 nm thick quantum well layer of InGaN and a 10 nm thick quantum barrier layer of GaN. Active layer 3 is considered to involve a first sublayer ALSL1 and a second sublayer ALSL2. ALSL1 and ALSL2 are disposed with respect to one another as illustrated in FIG. 3. FIG. 3 shows that first sublayer ALSL1 is about twenty-six nanometers thick. First sublayer ALSL1 has a silicon concentration more than $1 \times 10^{18}$ atoms/cm$^3$ (for example, $5 \times 10^{18}$ atoms/cm$^3$), and the second sublayer ALSL2 has a silicon concentration less than $1 \times 10^{18}$ atoms/cm$^3$ (for example, $5 \times 10^{18}$ atoms/cm$^3$).

P-type layer 2 is doped with magnesium to a concentration of more than $1 \times 10^{19}$ atoms/cm$^3$ (for example, $2 \times 10^{19}$ atoms/cm$^3$). The silicon concentration in the P-type layer is below $5 \times 10^{16}$ atoms/cm$^3$ (for example, as close to zero atoms/cm$^3$ as practical). P-type layer 2 has a concentration of indium of approximately $4 \times 10^{18}$ atoms/cm$^3$.

Inspection of line 13 of the silicon concentration profile in FIG. 3 reveals that two "peaks" 14 and 15 are present. Peak 14 corresponds to a bounding silicon-doped region (a layer having a silicon concentration greater than $1 \times 10^{18}$ atoms/cm$^3$) disposed directly underneath the strain release layer 4. The silicon-doped region is a first relatively-highly silicon-doped region that bounds the strain release layer. Peak 15 corresponds to a bounding silicon-doped region disposed directly on top of the strain release layer 4 (a layer having a silicon concentration greater than $1 \times 10^{18}$ atoms/cm$^3$). The silicon-doped region is a first relatively-highly silicon-doped region that bounds the strain release layer. The first and second relatively-highly silicon-doped regions (layers) sandwich the strain release layer from above and below and improve the performance of the LED device, at least in one specific embodiment.

In addition, relatively highly silicon-doped sublayer NSL3 in combination with relatively lightly silicon-doped sublayer NSL2 improve current spreading, and thereby increase LED output power (lumens/watt). Sublayer NSL3 is relatively conductive as compared to sublayer NSL2, so there is an increased amount of lateral current flow in sublayer NSL3 as compared to an example of an LED in which sublayers NSL2 and NSL3 are of the same conductivity.

FIG. 4 is a table that illustrates experimental results. Many LED device structures were fabricated, where the LED devices were substantially identical but for the LED devices having different silicon doping profiles in their active and strain release layers. Experiment #1 involved a strain release layer that was undoped with silicon. Experiment #2 involved a strain release layer that was uniformly doped throughout its thickness with a light concentration of silicon. Experiment #3 involved a LED where a thin portion of the active layer adjoining the strain release layer had a relatively high silicon concentration. This structure is referred to as having one "spike" at the interface between the active layer and the strain release layer. Experiment #4 involved a LED where a thin portion of the N-type layer adjoining the strain release layer had a relatively high silicon concentration. This structure is referred to as having one "spike" at the interface between the strain release layer and the N-type layer. Experiment #5 involved an LED device such as the LED device described above in connection with FIGS. 1-3, where a thin portion of the active layer adjoining the strain release layer had a relatively high silicon concentration, and where a thin portion of the N-type layer adjoining the strain release layer had a relatively high silicon concentration. Of all the samples tested, the LED device of experiment #5 had the lowest reverse leakage current (about 0.1 microamperes), the highest output power (140 lumens/watt), and the highest ESD breakdown voltage (about 4000 volts). The individual rows of the table of FIG. 4 do not list actual measured data for just one tested LED, but rather each row represents the noticed trend in the testing a many such LED devices.

FIG. 5 is a chart of SIMS (Secondary Ion Mass Spectroscopy) concentration profile data for various constituent element of an LED device. Lines 100-104 indicate the concentrations of the elements silicon, indium, aluminum, magnesium, and hydrogen, respectively. Depth on the horizontal axis is measured relative to the upper surface of the P-type layer of the LED device. Although the indium concentration 101 in the noted region of the strain release layer appears to be quite uniform throughout the strain release layer, the actual indium concentration varies as set forth in the table of FIG. 2. The uniform appearance of line 101 in FIG. 6 in the region of the strain release layer is due to resolution limitations of the SIMS testing equipment.

Peak 105 corresponds to sublayer NSL3 in the N-type layer. Peak 106 corresponds to sublayer ALSL1 in the active layer. Note that peak 106 is not entirely within the active layer, but rather peak 106 is seen straddling the interface between the active layer and the strain release layer. The SIMS data of FIG. 5 is for an LED structure where the second portion SRLP2 of the strain release layer is doped with silicon at a concentration of $5 \times 10^{18}$ atoms/cm$^3$ in the same way that sublayer ALSL1 of the active layer is doped. Accordingly, in some embodiments the bounding silicon-doped regions may extend into the strain release layer, from the top, from the bottom, or from the top and bottom, such that the first few (for example, three) periods of the strain release layer are doped with silicon at levels greater than $1 \times 10^{18}$ atoms/cm$^3$.

The high concentration of indium in strain release layer 4 better relieves the strain on the GaN and InGaN lattices caused by the lattice mismatch with silicon. The lattice mismatch between GaN and crystalline silicon causes a large tensile strain on the GaN layer at the interface with the silicon. Indium is added to the GaN in order to form the larger lattice constant of InGaN. In the embodiment of LED device 1 represented by the concentrations of FIG. 5, the indium concentration throughout strain release layer 4 is relatively constant. In other embodiments, the indium concentration in strain release layer 4 begins lower after sublayer NSL3 and gradually increases towards sublayer ALSL1.

In embodiments where the indium concentration is maintained relatively constant throughout strain release layer 4, the optimum range of the indium concentration is between $5 \times 10^{19}$ atoms/cm$^3$ and $5 \times 10^{20}$ atoms/cm$^3$. The concentration of indium in strain release layer 4 in the embodiment of FIG. 5 remains constant at about and $4 \times 10^{20}$ atoms/cm$^3$. Where the indium concentration in strain release layer 4 exceeded $5 \times 10^{20}$ atoms/cm$^3$, the performance of active layer 3 deteriorated. The optimum performance for LED device 1 over crystalline silicon was achieved with the aforementioned range of indium concentration in strain release layer 4 bounded by two regions NSL3 and ALSL1 of high silicon concentration, wherein the silicon dopant concentration in strain release layer 4 was below $5 \times 10^{16}$ atoms/cm$^3$. The silicon dopant concentration of sublayer NSL3 was higher than $1 \times 10^{18}$ atoms/cm$^3$, and the silicon dopant concentration of first sublayer ALSL1 was more than $1 \times 10^{18}$ atoms/cm$^3$.

Figure 6:
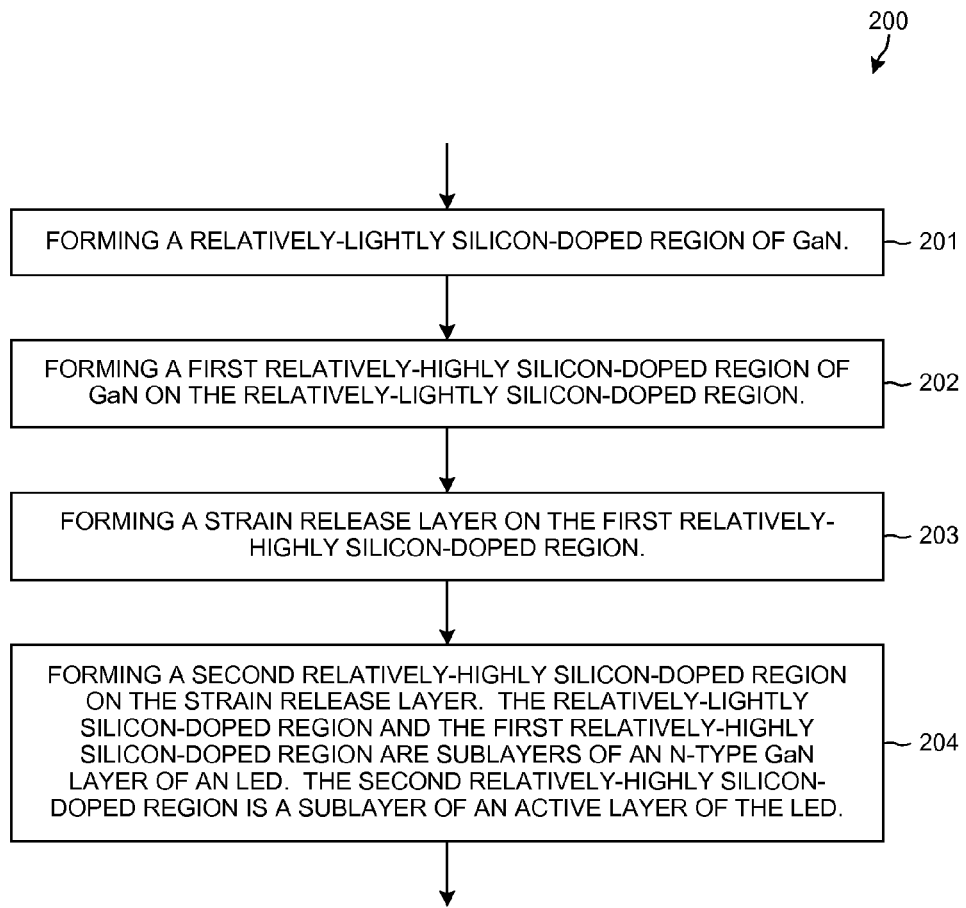
FIG. 6 is a flowchart of a method of manufacture in accordance with one novel aspect.

FIG. 6 is a flowchart of a method of manufacture 200 in accordance with one novel aspect. A relatively-lightly silicon-doped region of GaN is formed (step 201). In one example, this region is sublayer NSL2 of the N-type layer 5 of FIGS. 1-3. A first relatively-highly silicon-doped region of GaN is formed (step 202) on the relatively-lightly silicon-doped region. In one example, this region is sublayer NSL3 of the N-type layer 5 of FIGS. 1-3. A strain release layer is formed (step 203) on the first relatively-highly silicon-doped region. In one example, this strain release layer is strain release layer 4 of FIGS. 1-3 and it has a silicon concentration less than $5 \times 10^{16}$ atoms/cm$^3$. Strain release layer 4 has an indium concentration between $5 \times 10^{19}$ atoms/cm$^3$ and $5 \times 10^{20}$ atoms/cm$^3$.

A second relatively-highly silicon-doped region is then formed (step 204) on the strain release layer. In one example, the second relatively-highly silicon-doped region is sublayer ALSL1 of the active layer 3 of FIGS. 1-3. The relatively-lightly silicon-doped region formed in step 201 and the relatively-highly silicon-doped region formed in step 202 are parts of an N-type layer of an LED. The second relatively-highly silicon-doped region is a sublayer of an active layer of the LED. The various layers of the epitaxial stack of the LED device of FIG. 1 are formed by conventional MOCVD (Metal-Organic Chemical Vapor Deposition) processes using conventional source gases and techniques used in the manufacture of GaN LEDs.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus comprising:
   a substrate of silicon;
   a buffer layer adjacent to the substrate;
   an N-type layer adjacent to the buffer layer, wherein the N-type layer includes a first sublayer that has a first silicon dopant concentration;
   a strain release layer with a first portion and a second portion, wherein the first portion is adjacent to the first sublayer of the N-type layer, and wherein the strain release layer has a second silicon dopant concentration; and
   a multiple quantum well active layer with a sublayer, wherein the sublayer of the multiple quantum well active layer is adjacent to the second portion of the strain release layer, wherein the sublayer of the multiple quantum well active layer has a third silicon dopant concentration, wherein both the first silicon dopant concentration and the third silicon dopant concentration are higher than the second silicon dopant concentration,
   wherein the N-type layer further includes a second sublayer that has a fourth silicon dopant concentration and a third sublayer that is formed between the buffer layer and the second sublayer and has a fifth silicon dopant concentration, wherein the second sublayer is formed between the first sublayer and the third sublayer, and the fourth silicon dopant concentration is lower than the first silicon dopant concentration and the fifth silicon dopant concentration.

2. The apparatus of claim 1, wherein the first sublayer of the N-type layer and the sublayer of the multiple quantum well active layer are less than forty nanometers thick.

3. The apparatus of claim 1, wherein each of the first silicon dopant concentration and the third silicon dopant concentration exceeds $1 \times 10^{18}$ atoms/cm$^3$.

4. The apparatus of claim 1, wherein the second silicon dopant concentration is less than $5 \times 10^{16}$ atoms/cm$^3$.

5. The apparatus of claim 1, wherein the strain release layer has a concentration of indium that is between $5 \times 10^{19}$ atoms/cm$^3$ and $5 \times 10^{20}$ atoms/cm$^3$.

6. The apparatus of claim 1, wherein the strain release layer is more than one hundred nanometers thick.

7. The apparatus of claim 1, wherein the N-type layer comprises gallium nitride (GaN).

8. The apparatus of claim 1, wherein the strain release layer comprises indium gallium nitride (InGaN).

9. The apparatus of claim 1, wherein the sublayer of the multiple quantum well active layer includes a barrier layer.

10. The LED device of claim of claim 1, further comprising an n-electrode disposed on a surface of the N-type layer, a bottom of the third sublayer of the N-type layer being above the surface of the N-type layer on which the n-electrode is disposed.

11. A light emitting diode (LED) device comprising:
    a P-type layer;

a multiple quantum well active layer including a first sublayer and a second sublayer, the first sublayer having a first silicon concentration, the second sublayer having a second silicon concentration lower than the first silicon concentration;

a strain release layer comprising a plurality of periods, wherein each period comprises a first layer of indium gallium nitride and a second layer of indium gallium nitride, the first layer of indium gallium nitride having a first indium concentration, the second layer of indium gallium nitride having a second indium concentration different than the first indium concentration, the strain release layer having a third silicon concentration; and an N-type layer having a first sublayer, a second sublayer, and a third sublayer, the second sublayer disposed between the first sublayer and the third sublayer, the third sublayer formed adjacent to the strain release layer and having a fourth silicon concentration, the third sublayer disposed between the strain release layer and the second sublayer, the multiple quantum well active layer is disposed between the P-type layer and the strain release layer, wherein the first sublayer of the multiple quantum well active layer is formed adjacent to the strain release layer, and the third silicon concentration is lower than the first silicon concentration and the fourth silicon concentration, and wherein the first silicon concentration is higher than a silicon concentration of the remaining layers of the multiple quantum well active layer other than the first sublayer thereof.

12. The LED device of claim 11, wherein the first sublayer of the multiple quantum well active layer is a portion of the multiple quantum well active layer adjoining the strain release layer.

13. The LED device of claim 11, wherein the third sublayer of the N-type layer is a portion of the N-type layer adjoining the strain release layer.

14. The LED device of claim 11, wherein the first silicon concentration is higher than $1 \times 10^{18}$ atoms/cm$^3$, the second silicon concentration is lower than $1 \times 10^{18}$ atoms/cm$^3$, the third silicon concentration is lower than $5 \times 10^{16}$ atoms/cm$^3$.

15. The LED device of claim 11, wherein the second sublayer of the N-type layer is more than fifty nanometers thick, and the first sublayer of the multiple quantum well active layer is less than fifty nanometers thick.

16. The LED device of claim 11, wherein the first layer of each period of the strain release layer is less than five nanometers thick, and wherein the second layer of each period of the strain release layer is less than five nanometers thick.

17. The LED device of claim 11, wherein the first sublayer of the multiple quantum well active layer includes a barrier layer.

18. The LED device of claim of claim 11, wherein the first layer of indium gallium nitride is formed with the first indium concentration of 0-2×10$^{20}$ atoms/ccm, and the second layer of indium gallium nitride is formed with the second indium concentration of 0-2×10$^{20}$ atoms/ccm.

19. The LED device of claim of claim 11, further comprising an n-electrode disposed on a surface of the N-type layer, a bottom of the first sublayer of the N-type layer being above the surface of the N-type layer on which the n-electrode is disposed.

20. A light emitting diode (LED) device comprising:
a P-type layer;

a multiple quantum well active layer including a first sublayer and a second sublayer, the first sublayer having a first silicon concentration, the second sublayer having a second silicon concentration lower than the first silicon concentration;

a strain release layer comprising a plurality of periods, wherein each period comprises a first layer of indium gallium nitride and a second layer of indium gallium nitride, the first layer of indium gallium nitride having a first indium concentration, the second layer of indium gallium nitride having a second indium concentration different than the first indium concentration, the strain release layer having a third silicon concentration; and an N-type layer having a first sublayer, a second sublayer, and a third sublayer, the second sublayer disposed between the first sublayer and the third sublayer, the third sublayer formed adjacent to the strain release layer and having a fourth silicon concentration, the third sublayer disposed between the strain release layer and the second sublayer, the multiple quantum well active layer is disposed between the P-type layer and the strain release layer, wherein the first sublayer of the multiple quantum well active layer is formed adjacent to the strain release layer, and the third silicon concentration is lower than the first silicon concentration and the fourth silicon concentration, and wherein the strain release layer further comprises a portion having a fifth silicon concentration higher than the third silicon concentration, and the fifth silicon concentration is lower than the first silicon concentration.

21. The LED device of claim 20, wherein the first sublayer of the multiple quantum well active layer is a portion of the multiple quantum well active layer adjoining the strain release layer.

22. The LED device of claim 20, wherein the third sublayer of the N-type layer is a portion of the N-type layer adjoining the strain release layer.

23. The LED device of claim 20, wherein the first silicon concentration is higher than $1 \times 10^{18}$ atoms/cm$^3$, the second silicon concentration is lower than $1 \times 10^{18}$ atoms/cm$^3$, the third silicon concentration is lower than $5 \times 10^{16}$ atoms/cm$^3$.

24. The LED device of claim 20, wherein the second sublayer of the N-type layer is more than fifty nanometers thick, and the first sublayer of the multiple quantum well active layer is less than fifty nanometers thick.

25. The LED device of claim 20, wherein the first layer of each period of the strain release layer is less than five nanometers thick, and wherein the second layer of each period of the strain release layer is less than five nanometers thick.

26. The LED device of claim 20, wherein the first sublayer of the multiple quantum well active layer includes a barrier layer.

27. The LED device of claim of claim 20, wherein the first layer of indium gallium nitride is formed with the first indium concentration of 0-2×10$^{20}$ atoms/ccm, and the second layer of indium gallium nitride is formed with the second indium concentration of 0-2×10$^{20}$ atoms/ccm.

28. The LED device of claim of claim 20, further comprising an n-electrode disposed on a surface of the N-type layer, a bottom of the first sublayer of the N-type layer being above the surface of the N-type layer on which the n-electrode is disposed.

* * * * *